US010770266B2

(12) United States Patent
Nakano et al.

(10) Patent No.: US 10,770,266 B2
(45) Date of Patent: Sep. 8, 2020

(54) CHARGED PARTICLE BEAM DEVICE AND CAPTURING CONDITION ADJUSTING METHOD IN CHARGED PARTICLE BEAM DEVICE

(71) Applicant: Hitachi High-Tech Corporation, Minato-ku, Tokyo (JP)

(72) Inventors: Tomohito Nakano, Tokyo (JP); Toshiyuki Yokosuka, Tokyo (JP); Yuko Sasaki, Tokyo (JP); Minoru Yamazaki, Tokyo (JP); Yuzuru Mochizuki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/436,297

(22) Filed: Jun. 10, 2019

(65) Prior Publication Data

US 2020/0035449 A1 Jan. 30, 2020

(30) Foreign Application Priority Data

Jul. 26, 2018 (JP) ................................. 2018-140727

(51) Int. Cl.
*H01J 37/28* (2006.01)
*H01J 37/147* (2006.01)
*G01N 23/225* (2018.01)

(52) U.S. Cl.
CPC ............ *H01J 37/28* (2013.01); *G01N 23/225* (2013.01); *H01J 37/1478* (2013.01); *H01J 2237/14* (2013.01)

(58) Field of Classification Search
CPC .... H01J 37/28; H01J 37/1478; H01J 2237/14; H01J 37/065; G01N 23/225
USPC ................................ 250/306, 307, 310, 311
See application file for complete search history.

(56) References Cited

U.S. PATENT DOCUMENTS

| 2002/0074495 A1* | 6/2002 | Notte, IV | ............... | H01J 37/265 250/311 |
| 2008/0185519 A1* | 8/2008 | Takahashi | ............ | G01N 23/225 250/311 |

FOREIGN PATENT DOCUMENTS

JP        2008-192521 A      8/2008

* cited by examiner

*Primary Examiner* — Michael Maskell
(74) *Attorney, Agent, or Firm* — Crowell & Moring LLP

(57) ABSTRACT

A charged particle beam device includes an electron source which generates an electron beam, an objective lens which is applied with a coil current to converge the electron beam on a sample, a control unit which controls the current to be applied to the objective lens, a hysteresis characteristic storage unit which stores hysteresis characteristic information of the objective lens, a history information storage unit which stores history information related to the coil current, and an estimation unit which estimates a magnetic field generated by the objective lens on the basis of the coil current, the history information, and the hysteresis characteristic information.

12 Claims, 14 Drawing Sheets

FIG. 7

| Iobj | Bobj (CR) | GER | GIR |
|------|-----------|------|------|
| Iobj1 | Bobj1 | ger1 | gir1 |
| Iobj2 | Bobj2 | ger2 | gir2 |
| Iobj3 | Bobj3 | ger3 | gir3 |
| ⋮ | ⋮ | ⋮ | ⋮ |

CHARGED PARTICLE BEAM DEVICE AND CAPTURING CONDITION ADJUSTING METHOD IN CHARGED PARTICLE BEAM DEVICE

BACKGROUND OF THE INVENTION

1. Field of the Invention

The present invention relates to a charged particle beam device, and a capturing condition adjusting method in the charged particle beam device.

2. Description of the Related Art

As an example of a charged particle beam device, a scanning electron microscope (SEM) is known. As the charged particle beam device, there are a length measurement SEM and a review SEM other than a normal scanning electron microscope.

In the scanning electron microscope, an electron beam discharged from an electron source is emitted and converged on a sample by a magnetic field which is generated by an objective lens, and the generated back scattering electrons and the secondary electrons are measured and captured as an image. At this time, a focusing position of the electron beam is necessarily adjusted according to the height of the sample, and the adjusting can be realized by adjusting a coil current which is applied to the objective lens.

However, a magnetic circuit of the objective lens is generally configured by a ferromagnetic material. The relation between the coil current and the magnetic field generated by the objective lens is not uniquely set due to an influence of a magnetic hysteresis. Therefore, a deflection magnification and an image rotation are caused. As a method of avoiding the problem, JP 2008-192521 A discloses an electronic microscope which performs a lens reset process to keep a constant relation between the coil current of the objective lens and the magnetic field. A lens reset operation is an operation in which the coil current of the objective lens is once decreased down to the minimum value, and increased again to keep a magnetized state of the magnetic circuit of the objective lens constant, so that the relation between the coil current and the magnetic field can be set uniquely. However, in the lens reset process, the current applied to the objective lens is significantly changed. Therefore, an overcurrent is generated in the magnetic circuit to cause a delay in response of the magnetic field, and a throughput (the number of capturing times per unit time) is significantly lowered.

SUMMARY OF THE INVENTION

The invention is to provide a charged particle beam device and a capturing condition adjusting method in the charged particle beam device in which the frequency of lens resetting is reduced and a throughput is improved.

According to an aspect of the invention to solve the above problem, there is provided a charged particle beam device including an electron source which generates an electron beam, an objective lens which is applied with a coil current to converge the electron beam on a sample, a control unit which controls the coil current to be applied to the objective lens, a hysteresis characteristic storage unit which stores hysteresis characteristic information of the objective lens, a history information storage unit which stores history information related to the coil current, and an estimation unit which estimates a magnetic field generated by the objective lens on the basis of the coil current, the history information, and the hysteresis characteristic information.

According to the invention, it is possible to provide a charged particle beam device which can reduce the frequency of lens resetting and improve a throughput.

BRIEF DESCRIPTION OF THE DRAWINGS

FIG. 7 is a diagram illustrating an example of hysteresis characteristic information stored in a database 114;

DESCRIPTION OF THE PREFERRED EMBODIMENTS

Hereinafter, embodiments of the invention will be described with reference to the accompanying drawings. In the accompanying drawings, the elements having the same function may be attached with the same symbol. Further, the accompanying drawings illustrate embodiments and examples according to the principle of the disclosure in order to help with understanding of the disclosure, but the disclosure is not interpreted in a limited way. The description of this specification is given only as a typical example, and does not limit the scope of claims or applications of the disclosure.

In this embodiment, the explanation has been made in detail sufficiently for a person skilled in the art to implement the disclosure while other mounting/embodiments may be possible. It is necessary to understand that changes in configuration/structures and replacements of various elements may be implemented without departing from the scope of the technical ideas and the spirit of the disclosure. Therefore, the following description must not be interpreted in a limited way.

Further, the following embodiments will be described about a scanning electron microscope as an example of a charged particle beam device, but the invention may be applied to various types of charged particle devices (a length measurement SEM, a review SEM, etc.) within a scope not departing from the spirit of the invention.

First Embodiment

Figure 1:
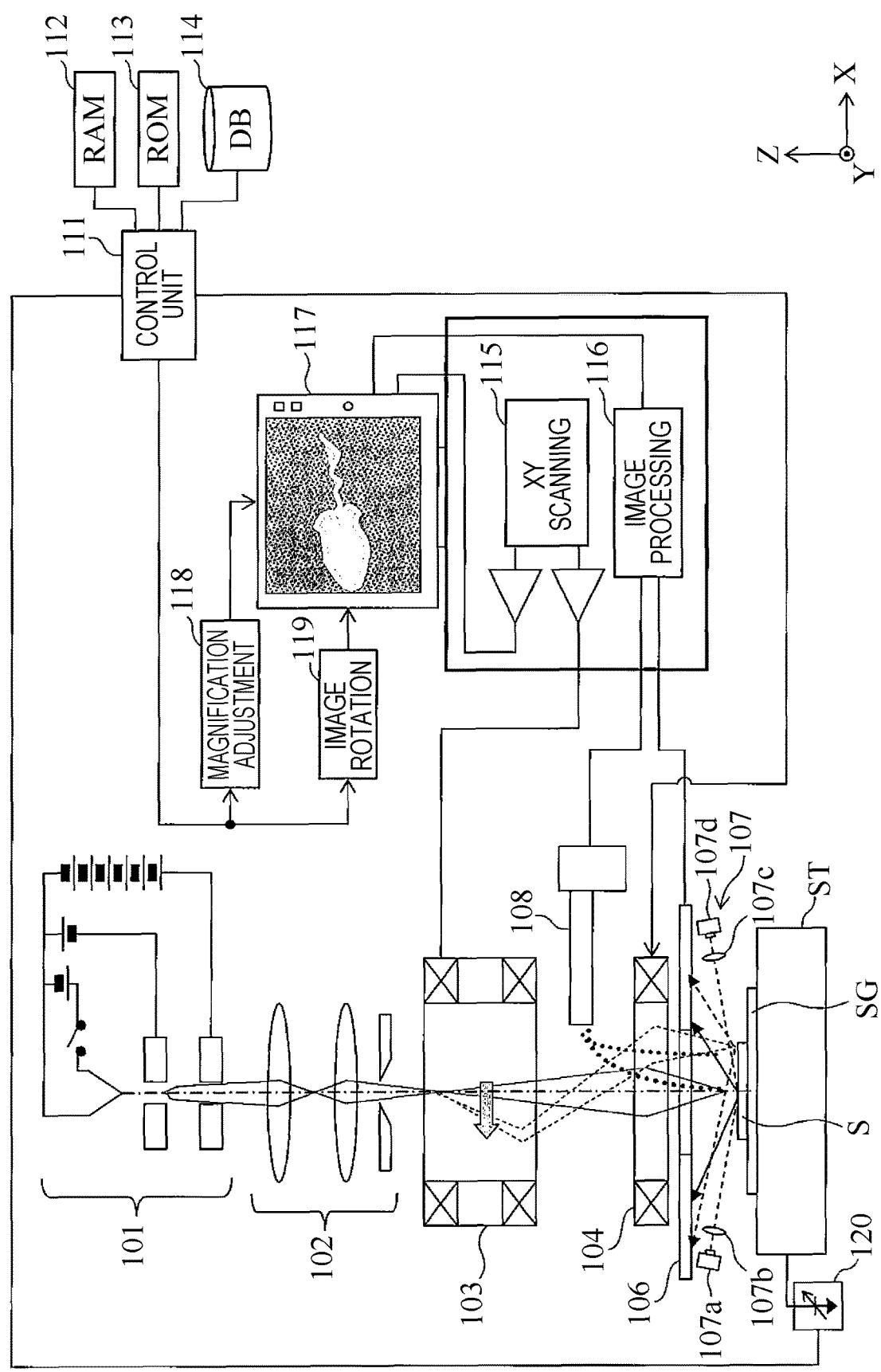
FIG. 1 is a schematic view of a scanning electron microscope (SEM) according to a first embodiment.

First, a first embodiment of the invention will be described. FIG. 1 illustrates a schematic view of a scanning electron microscope (SEM) as an aspect of the charged particle beam device according to the first embodiment. The scanning electron microscope includes, for example, an electron gun 101, a focusing lens 102, a scanning coil 103, an objective lens 104, a primary electron detector 106, a stage ST, an object surface position detector 107, and a secondary electron detector 108.

The electron gun 101 is an electron source which accelerates electrons with a predetermined acceleration voltage to generate an electron beam. The focusing lens 102 converges the electron beam to reduce the diameter of the electron beam. The scanning coil 103 has a role of scanning the electron beam. The objective lens 104 is applied with a coil current Iobj, condenses (converges) the electron beam, and irradiates a sample S placed on a slide glass SG on the stage ST with the electron beam of which the diameter is about several nm. The voltage applied to the scanning coil 103 causes the electron beam to move on the sample S.

The primary electron detector 106 is a detector which detects a primary electron (back scattering electron) reflected on the sample S. In addition, the object surface position detector 107 is a detector which detects a height of the surface of the sample S in a Z direction. The object surface position detector 107 includes, for example, a light source 107a, an imaging lens 107b, a condensing lens 107c, and a light receiving element 107d. The position (an object surface position Zs) of the surface of the sample S in the Z direction can be determined by determining a light receiving state in the light receiving element 107d.

The secondary electron detector 108 is a detector which detects a secondary electron generated from the sample S. Image information of the sample S is generated on the basis of output signals of the primary electron detector 106 and the secondary electron detector 108.

In addition, the scanning electron microscope includes a control unit 111, a RAM 112, a ROM 113, a database 114, an XY scanning unit 115, an image processing unit 116, a display 117, a magnification adjusting unit 118 (magnification correction unit), an image rotating unit 119 (rotation correction unit), and a retarding voltage control unit 120.

The control unit 111 controls the entire operation of the scanning electron microscope by controlling various voltages and currents in the scanning electron microscope. As described below, the control unit 111 also serves as an estimation unit which estimates a magnetic field generated by the objective lens 104 on the basis of the coil current, history information, and hysteresis characteristic information.

The RAM 112 and the ROM 113 serve to store programs and data to be used in the controlling operation. The RAM 112 serves as a history information storage unit which stores the history information indicating a history of changes of the coil current Iobj flowing to the objective lens 104.

The database 114 stores the hysteresis characteristic information of the objective lens 104 as described below. Specifically, the database 114 stores data of an outer circumferential curve ER which is a curve indicating a relation between the coil current Iobj and a magnetic flux density Bobj in a case where the coil current Iobj of the objective lens 104 is changed from a minimum value to a maximum value and is set back to the minimum value again. In addition, the database 114 stores data of an inner circumferential curve IR which is a curve where an operation point moves in a case where the coil current Iobj is switched between an increase state and a decrease state. The outer circumferential curve ER and the inner circumferential curve IR will be described below.

The XY scanning unit 115 scans the electron beam in an XY direction according to a dimension of a scanning region and a scanning speed. In addition, the image processing unit 116 performs an image processing according to the output signals of the primary electron detector 106 and/or the secondary electron detector 108, and generates image data which is displayed in the display 117. The display 117 displays the image on a display screen according to the image data (signal) which is generated by processing the signals from the detectors 106 and 108 by the image processing unit 116. The magnification adjusting unit 118 adjusts a magnification of the image data generated by the image processing unit 116 according to a control signal from the control unit 111. In addition, the image rotating unit 119 rotates the image data generated by the image processing unit 116 according to the control signal from the control unit 111.

The retarding voltage control unit 120 controls a retarding voltage Vr applied to the stage ST according to the control signal from the control unit 111. The retarding voltage Vr is a negative voltage applied to the sample S and the surroundings thereof, and decelerates the electron beam accelerated by the electron gun 101 immediately ahead of the sample S. A focusing position in the sample S can be adjusted by decelerating the electron beam. However, an electric field may be distorted by the application of the retarding voltage Vr, and the magnification and the angle of the SEM image to be obtained may be changed.

Figure 2:
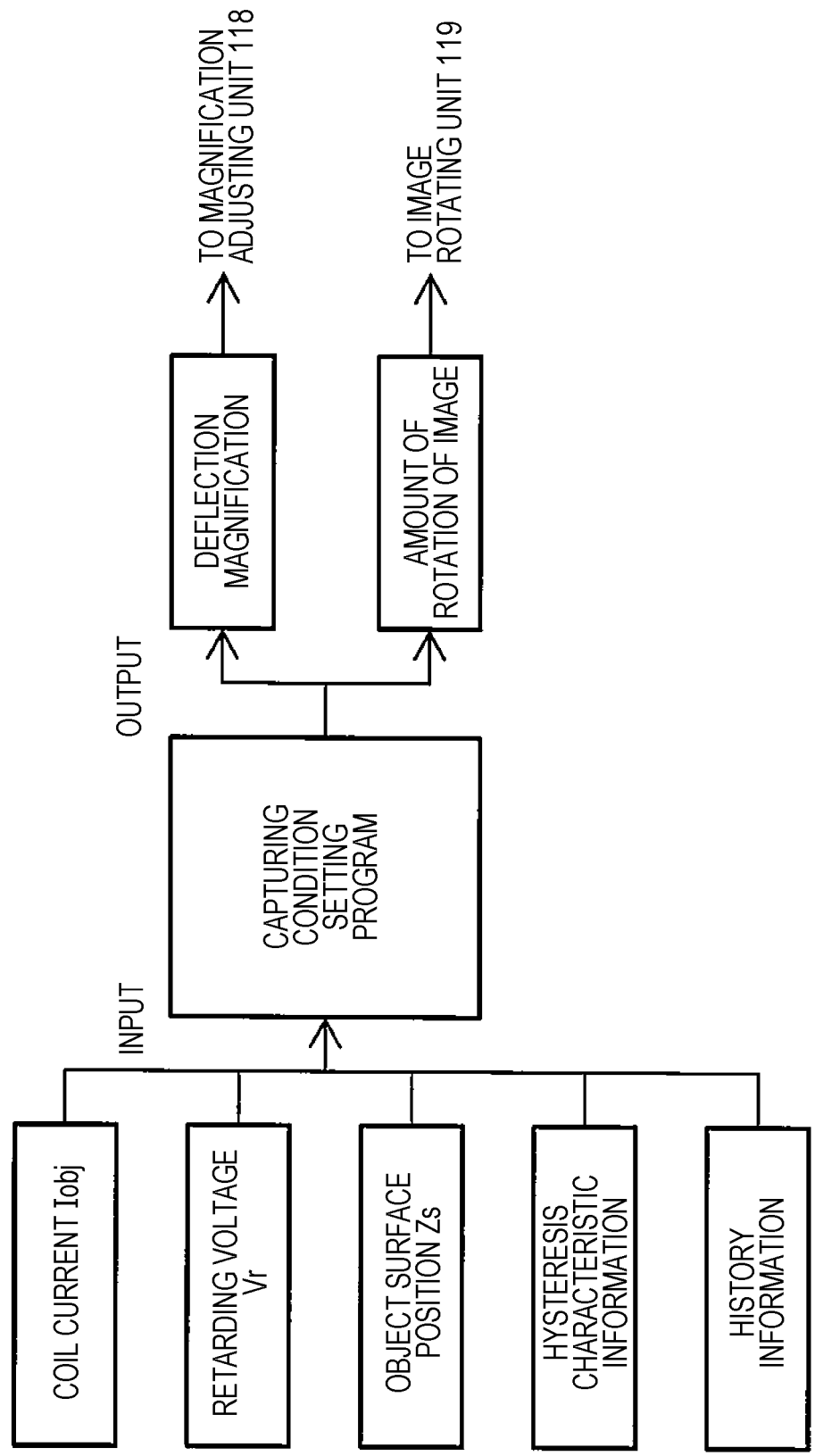
FIG. 2 is a block diagram for describing a capturing condition setting program of the scanning electron microscope (SEM) according to the first embodiment.

A control program stored in the ROM 113 includes a capturing condition setting program to set a capturing condition of the sample S. As illustrated in FIG. 2, the capturing condition setting program calculates a deflection magnification and an amount of rotation of image on the basis of information related to the coil current Iobj, information related to the retarding voltage Vr, information related to the object surface position Zs, the hysteresis characteristic information stored in the RAM 112 or the ROM 113, and the history information related to the history of changes of the coil current Iobj, and supplies the deflection magnification and the amount of rotation of image to the magnification adjusting unit 118 and the image rotating unit 119. Further, the information to be input to the capturing condition setting program as a factor of setting the capturing condition is not limited to the above information. Other information may be input instead or in addition of the above information.

The objective lens 104 is configured by a coil and a magnetic circuit made of a ferromagnetic material such as iron. When the coil current Iobj is applied to the coil on the basis of the sample height measured by the object surface position detector 107, the magnetic field is generated on the optical axis. At this time, the ferromagnetic material has a hysteresis characteristic. Therefore, even if the current Iobj is set to a certain value, the magnetic flux density Bobj on the optical axis fluctuates according to magnetization, and not set uniquely.

Figure 3:
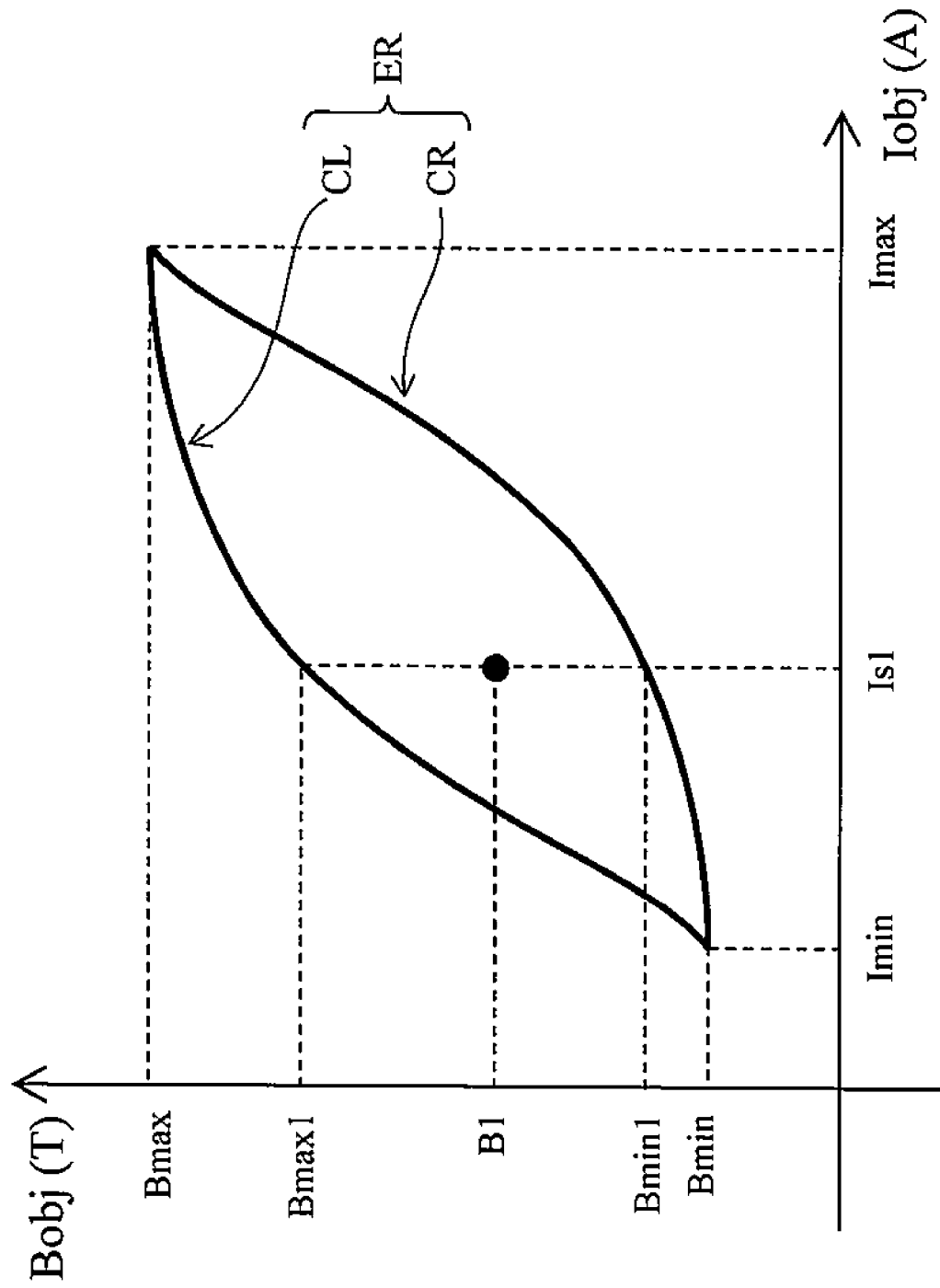
FIG. 3 is a graph for describing a hysteresis characteristic of an objective lens 104.

The hysteresis characteristic of the objective lens 104 will be described using FIG. 3. A maximum value of the coil current Iobj applied to the coil of the objective lens 104 is set to Imax, and a minimum value thereof is set to Imin. In addition, a maximum value of the magnetic flux density Bobj of the magnetic field generated around the objective lens 104 by the coil current Iobj is set to Bmax, and a minimum value thereof is set to Bmin.

When the coil current Iobj is monotonously increased from the minimum value Imin to the maximum value Imax in a state where a magnetized state of the objective lens 104 is reset, the relation between the coil current Iobj and the magnetic flux density Bobj is changed along a rising curve CR, for example. On the other hand, when the coil current Iobj is monotonously decreased toward the minimum value Imin again after increased to the maximum value Imax, the relation between the coil current Iobj and the magnetic flux density Bobj is changed along a falling curve CL, for example.

In general, in the scanning electron microscope, the rising curve CR or the falling curve CL (hereinafter, a curve obtained by combining the rising curve CR and the falling curve CL is called the outer circumferential curve ER) is obtained in advance, and the value of the magnetic flux density Bobj is calculated (estimated) with reference to the data of the outer circumferential curve ER.

Herein, in a case where the coil current Iobj is changed in various histories between the maximum value Imax and the minimum value Imin, the relation between the coil current Iobj and the magnetic flux density Bobj falls within the range of a closed curve surrounded by the outer circumferential curve ER instead of a point on the outer circumferential curve ER. In other words, the relation between the coil current Iobj and the magnetic flux density Bobj is not set uniquely. For example, even if the value of the coil current Iobj is determined to Is1, the value B1 of the magnetic flux density Bobj (see FIG. 3) becomes any value between a maximum value Bmax1 and a minimum value Bmin1, and the value of the magnetic flux density Bobj is not possible to be estimated.

If the relation between the coil current Iobj and the magnetic flux density Bobj is not determined uniquely, there is a need to adjust the retarding voltage Vr for focusing. In this case, however, an error occurs in the deflection magnification and the amount of rotation of image which are calculated with the coil current Iobj as an input. Therefore, reproducibility of the image and the length measurement is degraded.

Figure 4:
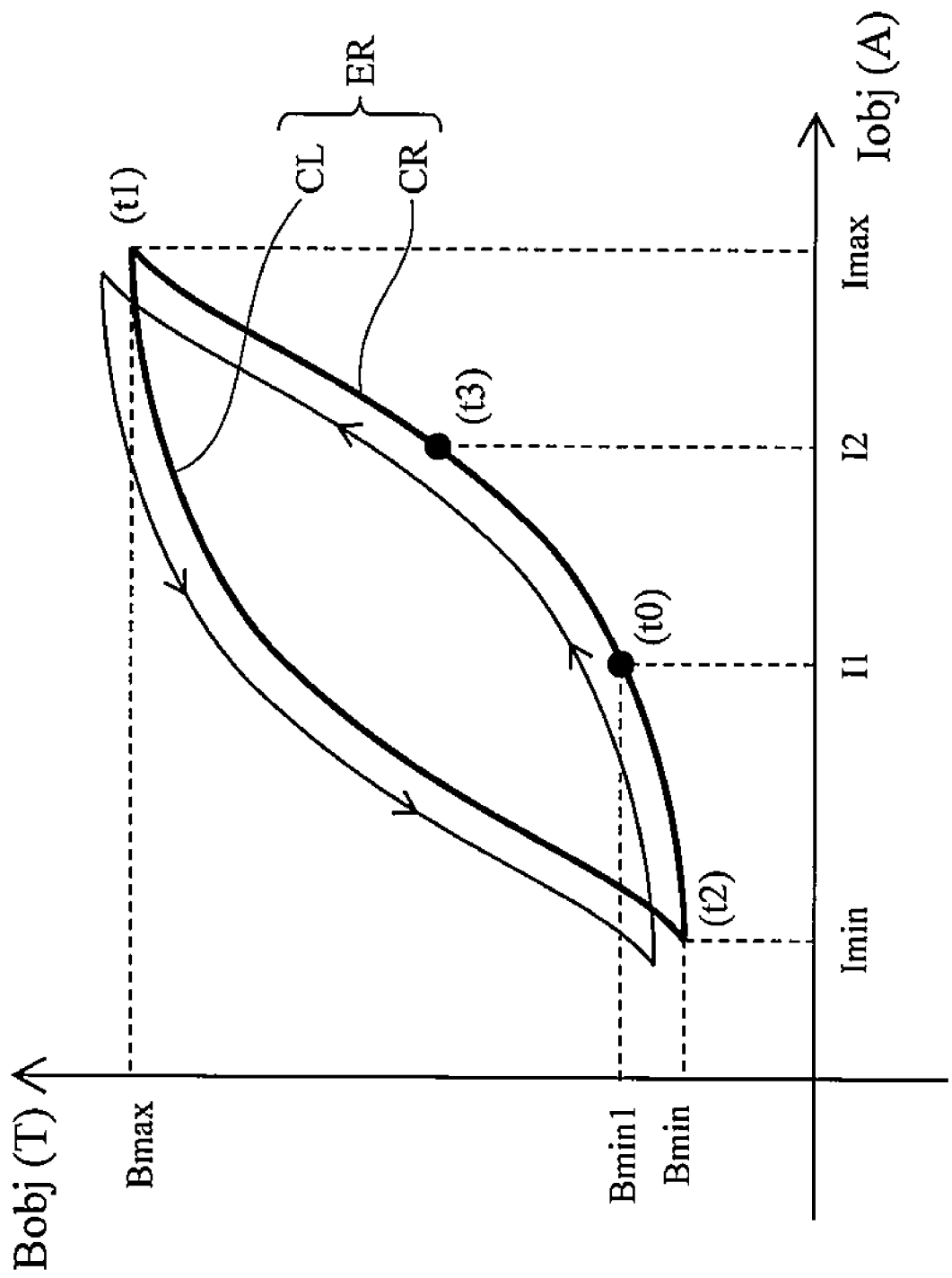
FIG. 4 is a schematic view for describing a specific example of a lens reset operation.
Figure 5:
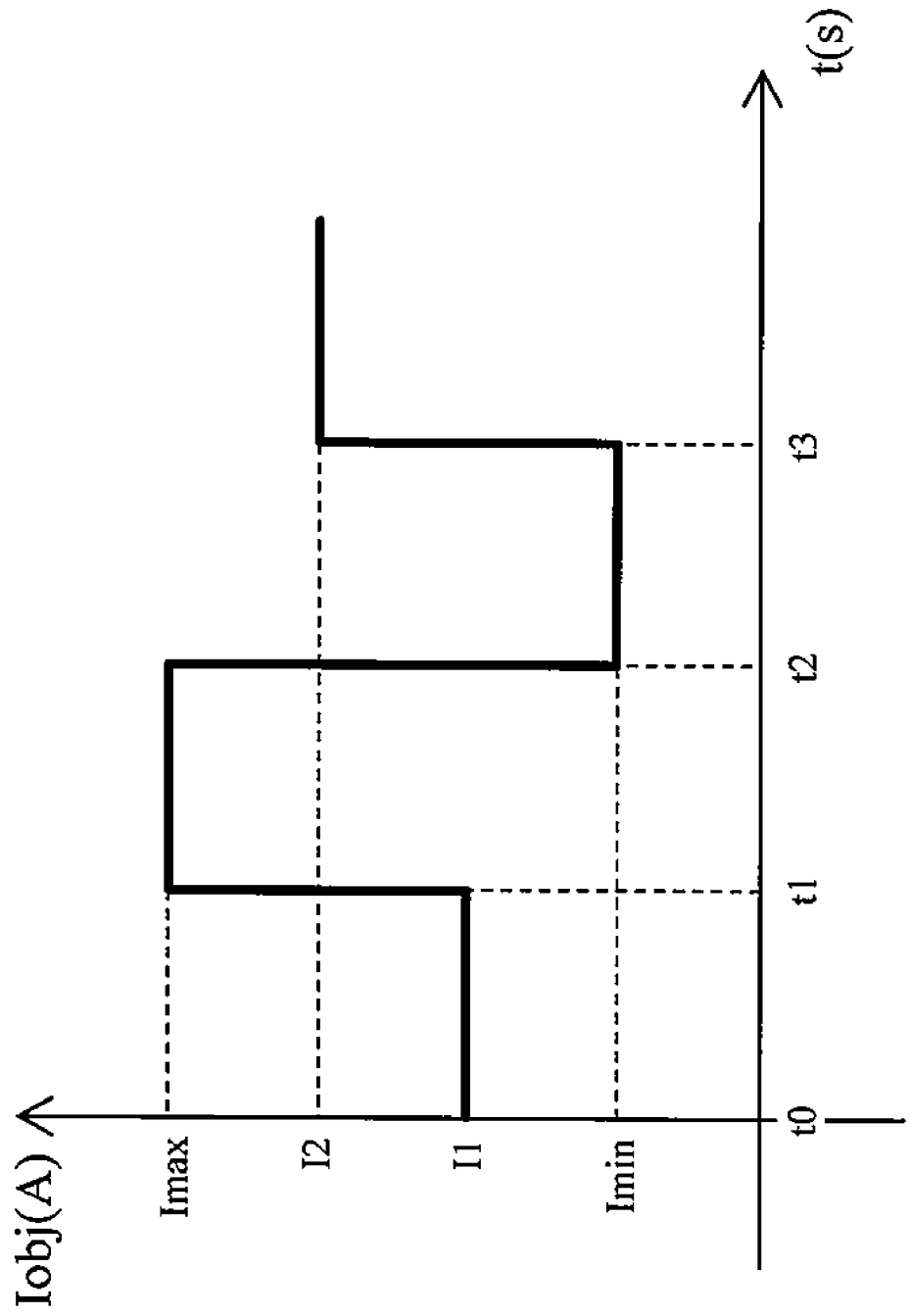
FIG. 5 is a graph for describing a specific example of the lens reset operation.

Therefore, in the scanning electron microscope of the related art, in a case where a change amount of the coil current Iobj becomes equal to or more than a certain value, an operation called a lens reset is performed. As described above, a lens reset operation is an operation in which the coil current Iobj of the objective lens is once decreased down to the minimum value Imin, and increased again to keep a magnetized state of the magnetic circuit of the objective lens constant. A specific example of the lens reset operation will be described with reference to FIGS. 4 and 5. FIG. 4 is a graph illustrating a change of the coil current Iobj and the magnetic flux density Bobj at the time of the lens reset operation. FIG. 5 is a graph illustrating a change of the coil current Iobj with time.

In a case where the value of the coil current Iobj is I1 at time t0, and then the coil current Iobj is changed to a target value I2 larger the current I1 by a predetermined value or more, the lens reset operation is performed to reset the magnetized state. In the lens reset operation, first, the coil current Iobj is increased to the maximum value Imax at time t1, and then decreased to the minimum value Imin at time t2 after a predetermined time. Then, the coil current is increased to the target value I2 at time t3. In this way, the coil current Iobj is increased to the maximum value Imax, and set back to the minimum value Imin to reset the magnetized state of the objective lens 104. The relation between the coil current Iobj and the magnetic flux density Bobj is defined by the rising curve CR again. When the coil current Iobj is determined, the magnetic flux density Bobj is set uniquely. However, since the amount of current change is large in the lens reset operation, a standby time until the magnetic field responses becomes long (for example, several tens of second), and a throughput may be lowered.

Figure 6A:
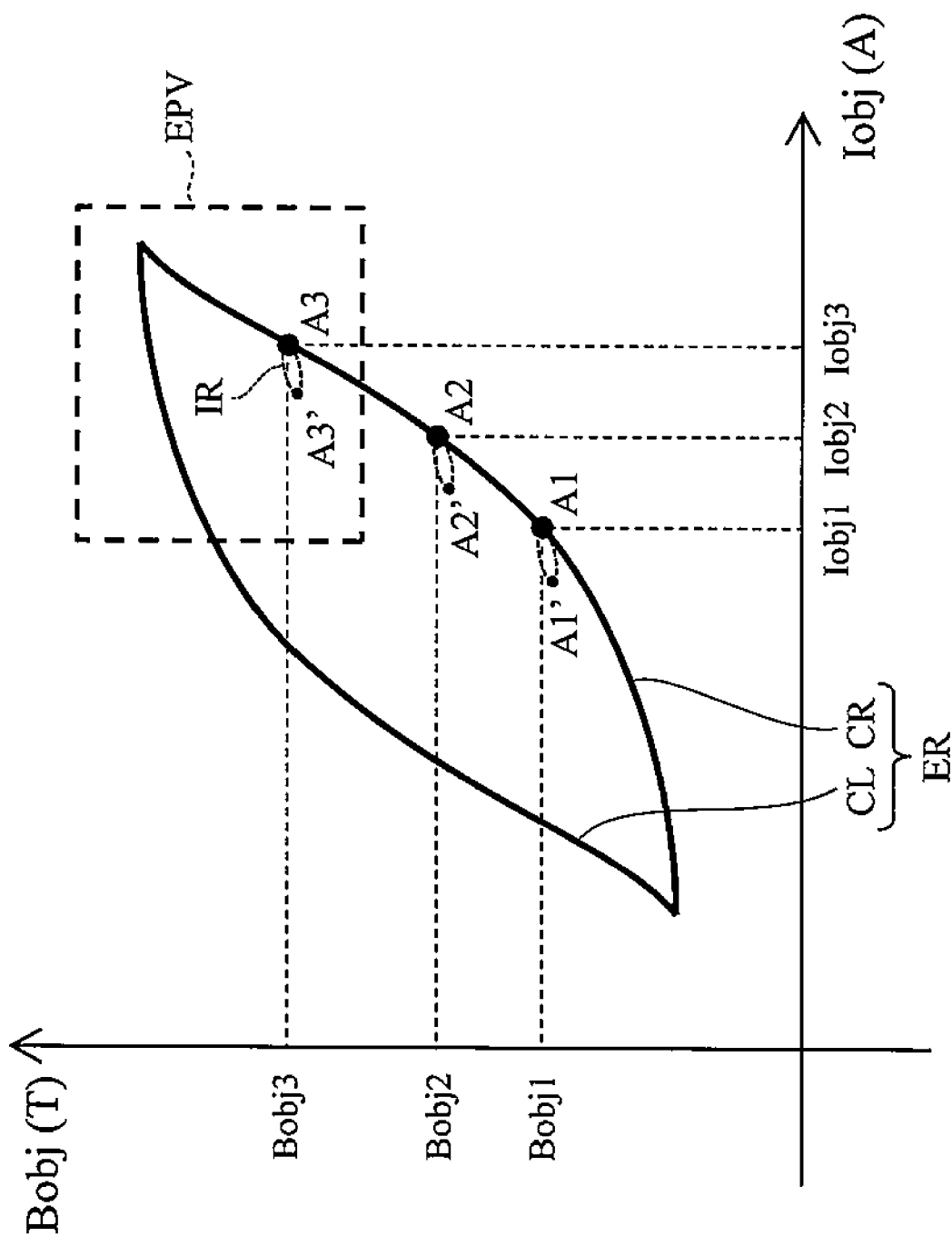
FIG. 6A is a graph for describing a method of estimating a magnetic field in the first embodiment.
Figure 6B:
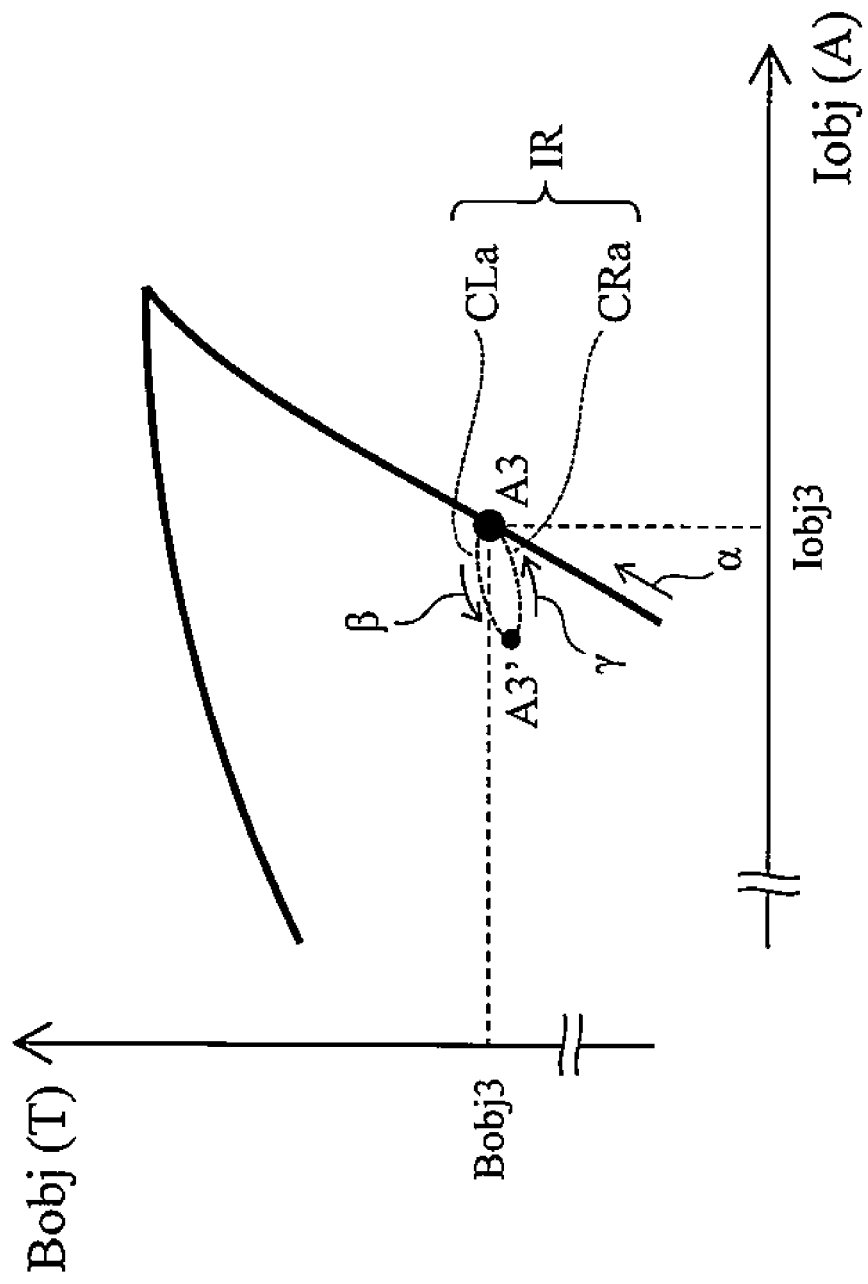
FIG. 6B is an enlarged view of a portion of a closed curve EPV of FIG. 6A.
Figure 6C:
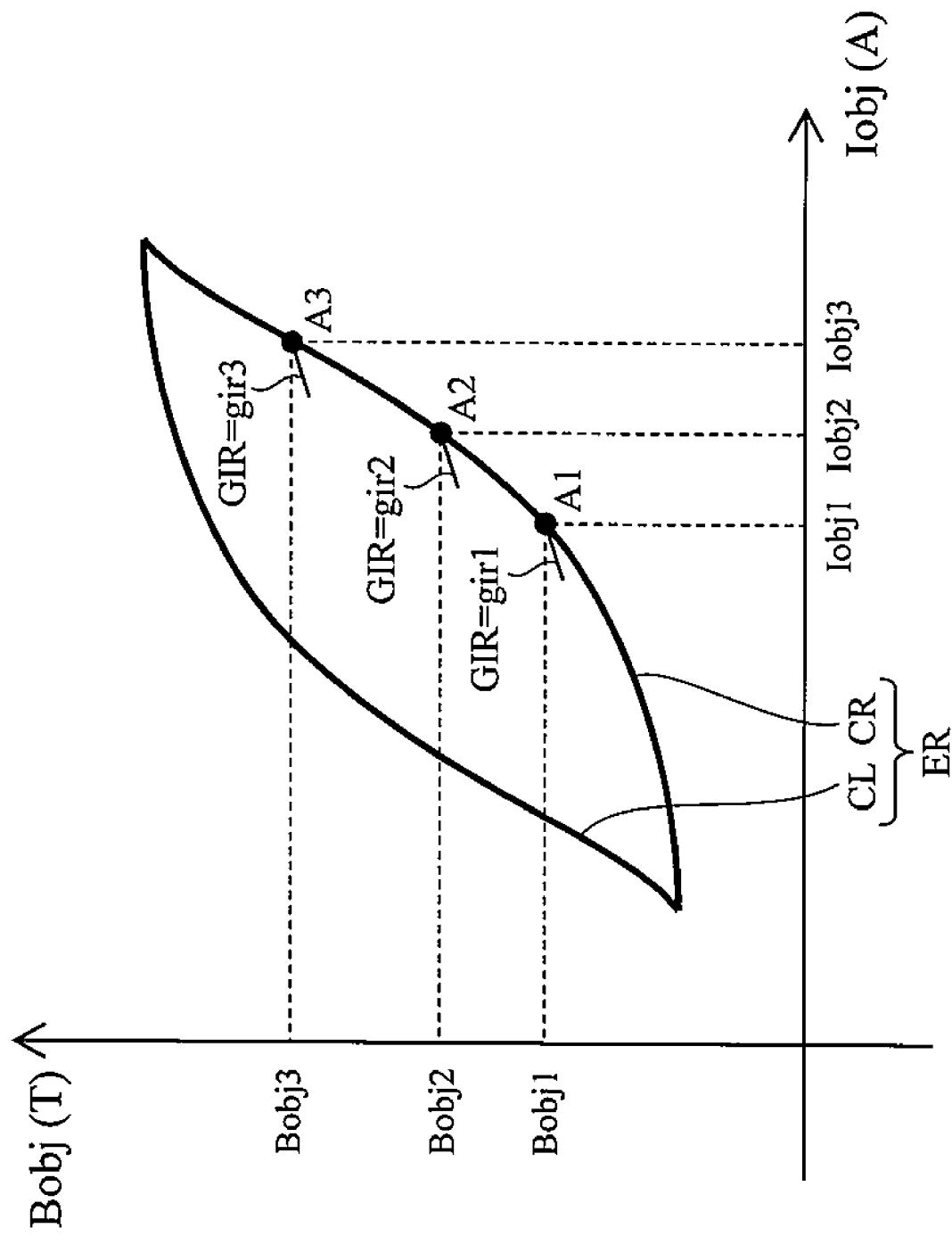
FIG. 6C is a graph for describing the method of estimating the magnetic field in the first embodiment.

Accordingly, the first embodiment employs the configuration and the operation illustrated in FIGS. 6A to 6C, thereby estimating the magnetic field generated by the objective lens 104 without using the lens reset operation. FIG. 6A is a graph for describing a method of estimating the magnetic field in the first embodiment. FIG. 6B is an enlarged view of a portion of the closed curve EPV of FIG. 6A. In addition, FIG. 6C is a graph for describing another example of the method of estimating the magnetic field.

Specifically, in the first embodiment, as illustrated in FIG. 6A, not only the outer circumferential curve ER but also the information of the inner circumferential curves IR on the inner side thereof is stored in the database 114 as the hysteresis characteristic information. Then, it is determined whether the operation point is on the outer circumferential curve ER or the inner circumferential curve IR according to the obtained information. When the control unit 111 refers to the database 114, the magnetic field of the objective lens 104 is estimated. The deflection magnification and the image rotation amount are corrected according to the estimated magnetic field. Alternatively, the coil current flowing to the focusing lens 102 and the current input to the XY scanning unit 115 are controlled (corrected) according to the estimated magnetic field, so that the scanning region scanned by the XY scanning unit 115 is corrected, and a change magnification and the amount of rotation of image may be adjusted.

The details of the estimation method (a method of adjusting a capturing condition) of the magnetic field in the first embodiment will be described with reference to FIG. 6A. As described above, in a case where the lens reset operation is completed, and the coil current Iobj monotonously increases/decreases between the minimum value Imin and the maximum value Imax, the operation point of the objective lens 104 is on the outer circumferential curve ER. In particular, in a case where a lens reset process is completed as described with reference to FIGS. 4 and 5, and the coil current Iobj monotonously increases from the minimum value Imin as an arrow α (FIG. 6B), the operation point is on the curve CR.

It is assumed here that, after the coil current Iobj increases along the arrow α, the coil current Iobj is shifted from increasing to decreasing at point A3, for example. In this case, the operation point deviates from the curve CR, and moves inside the outer circumferential curve ER in a direction of an arrow β along a curve CLa depicted with a broken line as illustrated in FIG. 6B.

If the coil current Iobj is shifted from increasing to decreasing at point A3 after increasing, and further decreases to point A3'. When the coil current is then shifted to increasing again, the operation point moves in a direction of an arrow γ along a curve CRa. In this case, the operation point returns to the original point A3 due to the characteristic of the magnetic hysteresis. In other words, the closed curve is configured by the curves CLa and CRa. The closed curve of the curves CLa and CRa will be called the inner circumferential curve IR below. Further, in a case where the increase/decrease of the current is reversed again in the inner circumferential curve IR, the locus becomes more complicated. However, if the coil current Iobj becomes the same current as that at point A3, the operation point surely returns to A3. Therefore, as the hysteresis characteristic information, the outer circumferential curve ER and the information of the inner circumferential curves IR different for each coil current Iobj (each point where the coil current Iobj is shifted from increasing to decreasing) are stored in the database 114. The magnetic field can be estimated with appropriate reference to the hysteresis characteristic information.

Further, the inner circumferential curve IR has a narrow width compared to the outer circumferential curve ER. Therefore, as illustrated in FIG. 6C, the inner circumferential curve IR can be approximated to a straight line. The outer circumferential curve ER and the inner circumferential curve IR approximated to a straight line can be stored in the database 114. In a case where the coil current Iobj monotonously increases from the minimum value Imin after the lens reset operation, the magnetic field can be estimated on the basis of the outer circumferential curve ER. On the other hand, in a case where the coil current Iobj is shifted from increasing to decreasing in any of the curve CR, the magnetic field can be estimated on the basis of the inner circumferential curve IR approximated to a straight line.

FIG. 7 illustrates an example of a method of storing, in the database 114, data of the outer circumferential curve ER and the inner circumferential curves IR approximated to a straight line. Each row of the table of FIG. 7 indicates a combination of the coil current Iobj, the magnetic flux density Bobj, and the slope GER of the outer circumferential curve ER at each operation point in a case where the operation point moves on the outer circumferential curve ER, and the slope GIR of the inner circumferential curve IR in a case where the coil current Iobj is reversed at the operation point. After the lens reset operation, the coil current Iobj is specified, and the magnetic field generated by the objective lens 104 can be estimated with reference to the database 114 based on the coil current.

Next, the operation (a method of adjusting a capturing condition) of the scanning electron microscope of the first embodiment will be described with reference to FIG. 9, while comparing it with the operation (FIG. 8) of the scanning electron microscope of the related art.

Figure 8:
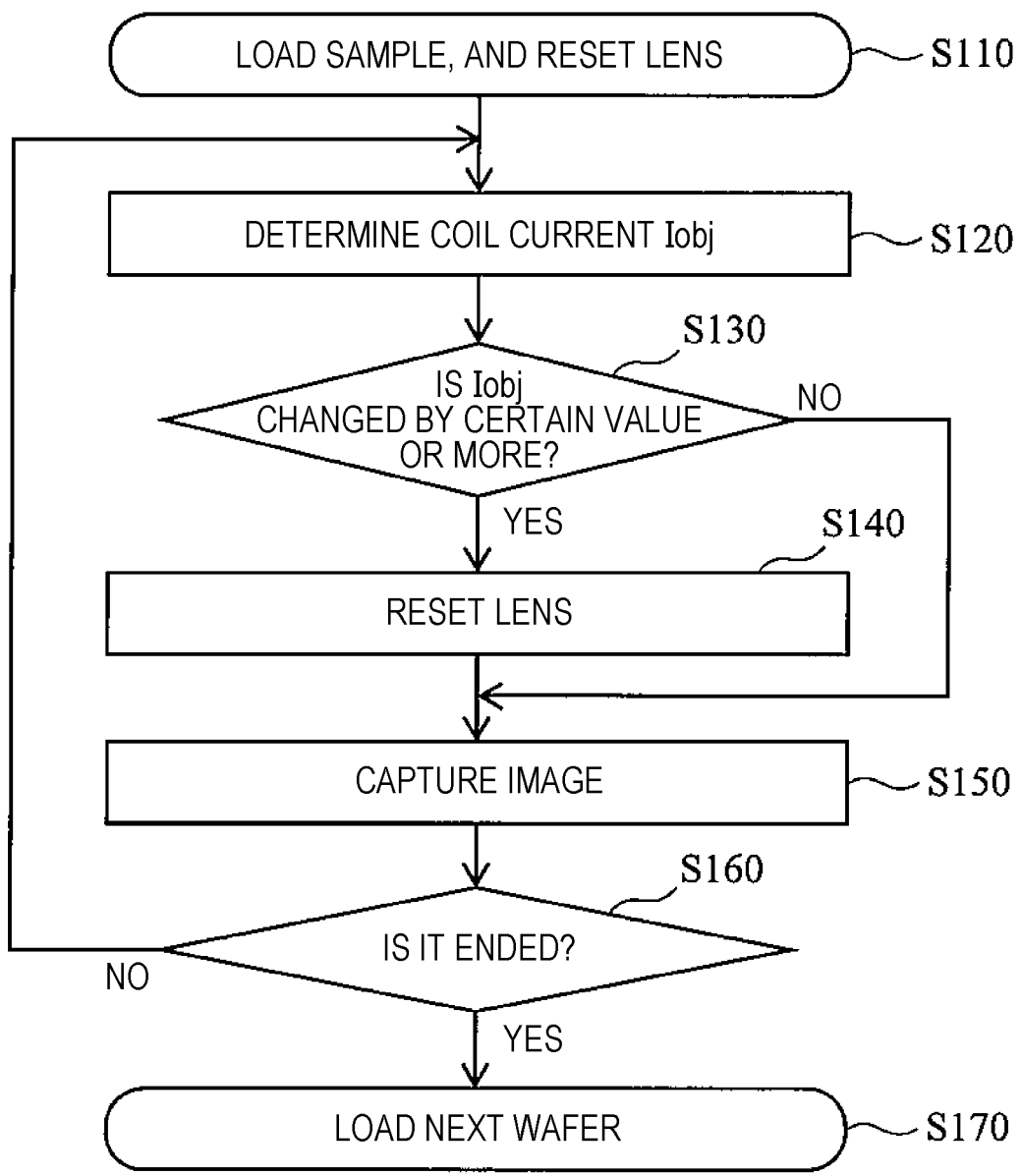
FIG. 8 is a flowchart illustrating an operation of the scanning electron microscope (SEM) of the related art.
Figure 9:
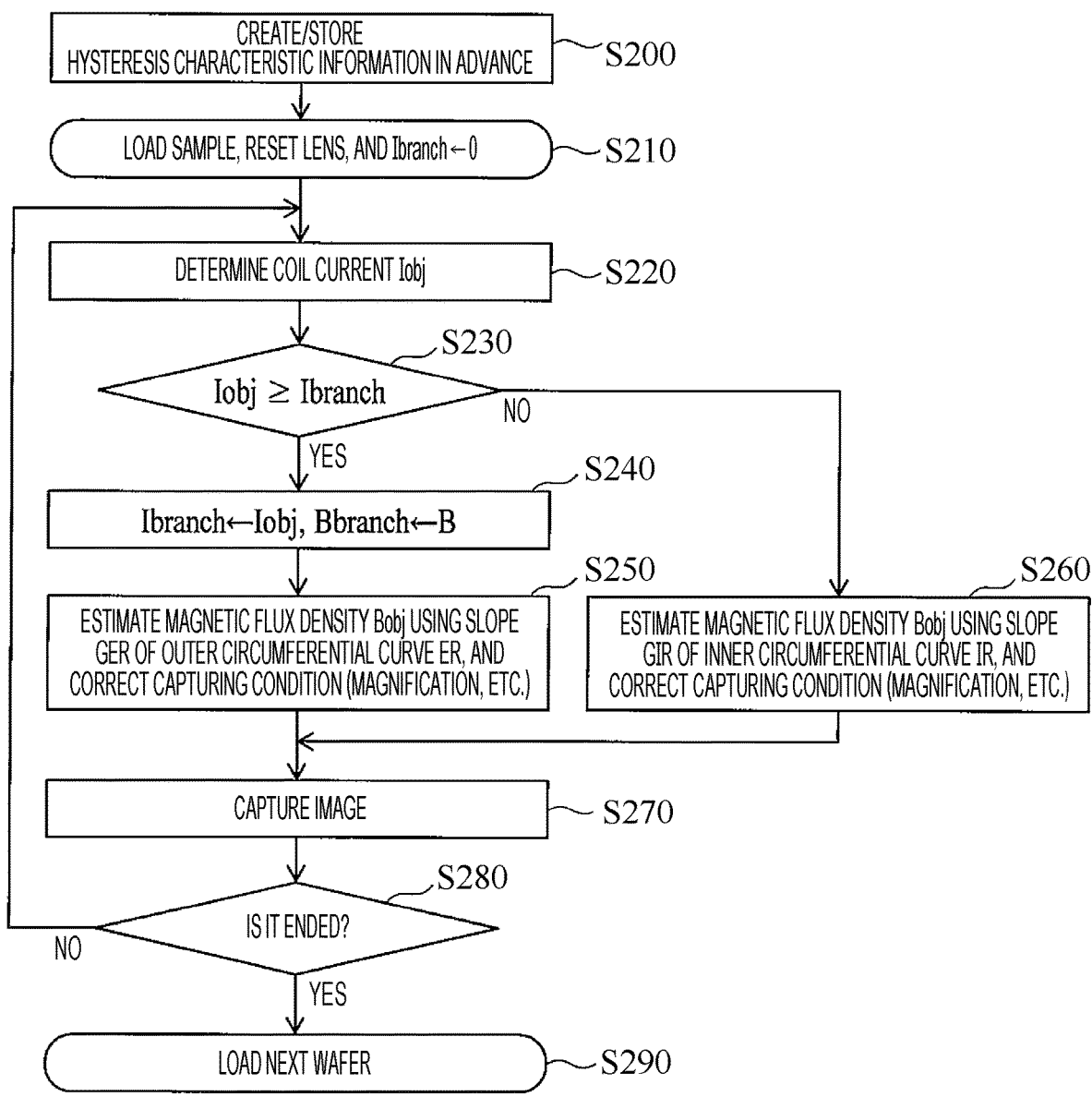
FIG. 9 is a flowchart illustrating an operation of the scanning electron microscope (SEM) according to the first embodiment.

As illustrated in FIG. 8, in the scanning electron microscope of the related art, the sample S is loaded on the stage ST first, and the lens reset operation described with FIGS. 4 and 5 is performed (Step S110).

Thereafter, the value of the coil current Iobj to be applied to the objective lens 104 is determined on the basis of the height of the sample S (Step S120). At this time, depending on the history of changes of the coil current Iobj, the relation between the coil current Iobj and the magnetic flux density Bobj may be deviated from the already-known rising curve CR, due to the hysteresis characteristic. It is not possible to determine the degree of the deviation. Therefore, in the scanning electron microscope of the related art, it is determined whether the coil current Iobj is changed by a certain value or more from the previous value (Step S130). In a case where the coil current is changed by a certain value or more, the lens reset operation is performed (Step S140), and image capturing is performed after the lens reset operation is completed (Step S150). If there is a next sample S, the sample is loaded, and the similar capturing is repeated (Steps S160 and S170). In this way, in the scanning electron microscope of the related art, the number of times of the lens reset operations is increased, and the throughput is lowered.

On the other hand, in the scanning electron microscope of the first embodiment, as described above, the information of the outer circumferential curve ER and the inner circumferential curve IR is stored in the database 114 as the hysteresis characteristic information (Step S200). The number of times of the lens reset operations is reduced using the information, and the throughput is improved.

In Step S210, the lens reset operation (FIGS. 4 and 5) is performed after the sample S is loaded. Further, a variable Ibranch is initialized to 0. The variable Ibranch is a variable that stores the maximum value of the coil current Iobj in a case where the coil current Iobj is increased or decreased. The variable Ibranch serves as history information indicating a history of changes of the coil current Iobj, which indicates how the maximum value of the coil current Iobj changes. The variable Ibranch can be stored in the RAM 112, for example.

Subsequently, the coil current Iobj is determined (Step S220). In the first embodiment, even if the change amount ΔIobj of the coil current Iobj is equal to or more than a predetermined value, the lens reset operation is not performed unless the followings are not met. It is determined whether the coil current Iobj is equal to or more than the variable Ibranch (Iobj Ibranch). Depending on the result, it is determined whether the operation point is on the outer circumferential curve ER, or on the inner circumferential curve IR (Step S230).

In a case where it is determined that the coil current Iobj is equal to or more than the variable Ibranch in Step S230 (Yes), it is determined that the coil current Iobj is increasing monotonously, and the operation point is on the outer circumferential curve ER during a monotonous increase of the coil current Iobj. Therefore, the variable Ibranch is updated to the value of the latest coil current Iobj (Step S240). Then, since the operation point is determined as still being on the outer circumferential curve ER, the slope GER of the outer circumferential curve ER and the value of the magnetic flux density Bobj are estimated on the basis of the information related to the outer circumferential curve ER and the value of the coil current Iobj. The capturing condition (the deflection magnification, the amount of rotation of image, etc.) is corrected on the basis of the value of the estimated magnetic flux density Bobj, and is transmitted to the magnification adjusting unit 118 and the image rotating unit 119. The SEM image is corrected (Step S250), and the image capturing is performed (Step S270).

On the other hand, in a case where the coil current Iobj is less than the variable Ibranch in Step S230 (No), it is determined that the coil current Iobj is shifted from increasing to decreasing, and the operation point is separated from the outer circumferential curve ER. Therefore, in Step S260, the corresponding inner circumferential curve IR is specified with reference to the database 114 on the basis of the value of the coil current Iobj. The value of the slope GIR of the corresponding inner circumferential curve IR is specified, and the value of the magnetic flux density Bobj is estimated according to the value of the slope GIR. The capturing condition (the deflection magnification, the amount of rotation of image, etc.) is corrected on the basis of the value of the specified magnetic flux density Bobj, is transmitted to the magnification adjusting unit 118 and the image rotating unit 119. The SEM image is corrected (Step S260), and the image capturing is performed (Step S270).

In this way, according to the first embodiment, in a case where the operation point moves along the outer circumferential curve ER, even if the coil current Iobj is switched from increasing to decreasing, the magnetic flux density Bobj can be estimated with accuracy without performing the lens reset operation according to the information of the inner circumferential curve IR. Therefore, it is possible to provide the scanning electron microscope in which the frequency of the lens reset operation is reduced, and the throughput is improved.

Further, in the above embodiment, the variable Ibranch indicating the maximum value of the coil current Iobj is recorded as the history information of the coil current Iobj, and the switching from increasing to decreasing of the coil current Iobj is determined. Instead of the variable Ibranch, the history of changes of the coil current Iobj may be recorded in various types of formats. For example, a temporal change of the coil current Iobj may be monitored and recorded, and the time point at which the slope is changed from positive to negative may be detected.

In addition, the above description has been made about a case where the estimation of the magnetic field along the inner circumferential curve IR is performed in a case where the coil current Iobj is shifted from increasing to decreasing when rising along the curve CR. In addition, even in a case where the coil current Iobj is shifted from decreasing to increasing when the coil current Iobj reaches the maximum value Imax and then monotonously decreases along the curve CL, the inner circumferential curve information IR can be used. In other words, in the first embodiment, in a case where the coil current Iobj is switched between increasing and decreasing before the coil current Iobj reaches the maximum value Imax or the minimum value Imin after the lens reset process, the magnetic field can be estimated according to the inner circumferential curve information IR indicating the relation between the coil current Iobj and the magnetic flux density Bobj in the switching.

Second Embodiment

Next, a scanning electron microscope according to a second embodiment of the invention will be described with reference to FIG. 10. The appearance of the scanning electron microscope of the second embodiment is the same as that of the first embodiment (FIG. 1), and the redundant description will be omitted. However, in the second embodiment, the method of estimating the magnetic flux density is different. The difference will be described with reference to FIG. 10.

Figure 10:
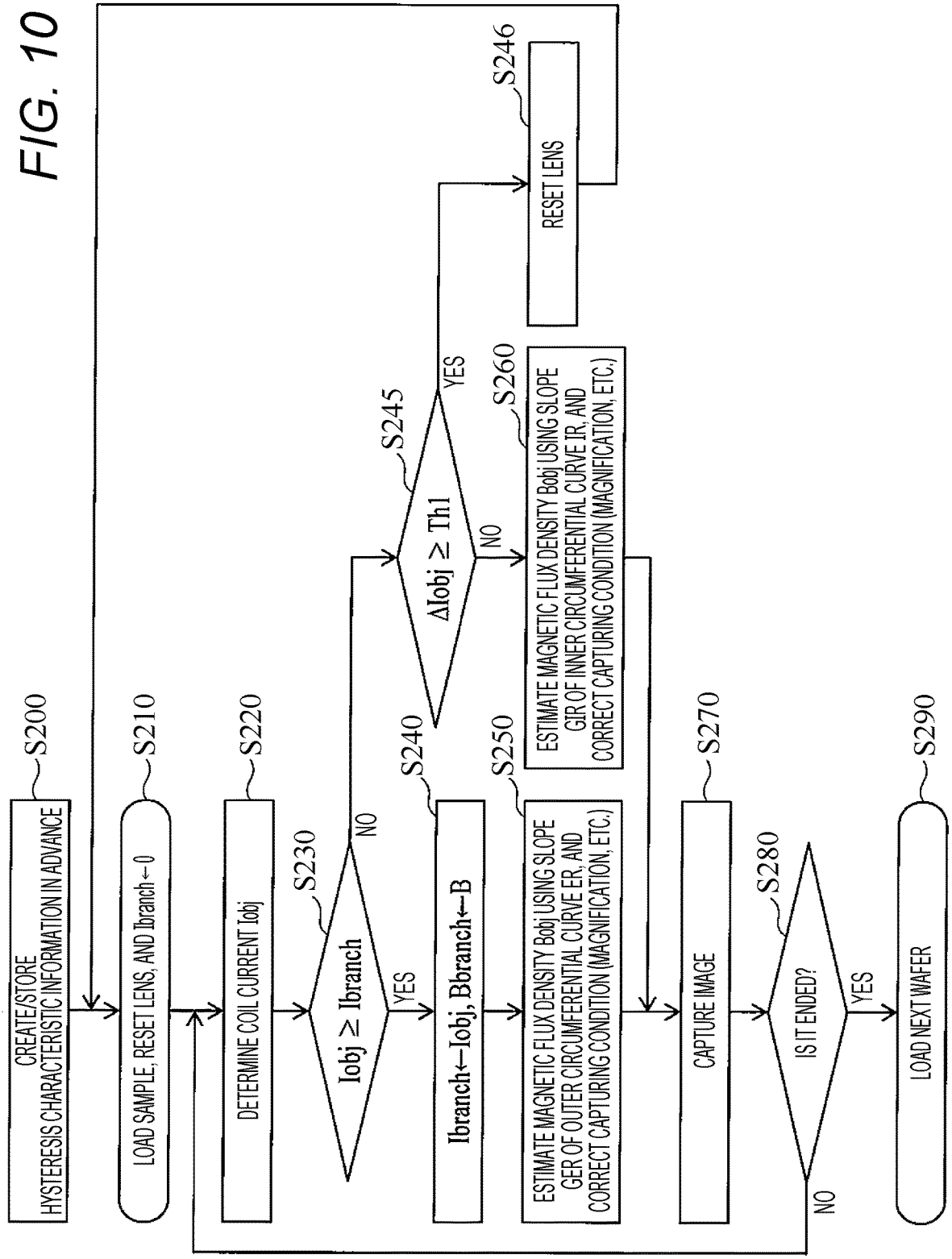
FIG. 10 is a flowchart illustrating an operation of the scanning electron microscope (SEM) according to a second embodiment.

In FIG. 10, Steps S200 to S280 are the same as those of the first embodiment, and the description thereof will be omitted. The difference is that it is determined whether the change amount ΔIobj of the coil current Iobj after Step S230 is equal to or more than a threshold Th1 after the determination on No in Step S230 (Step S245). In a case where the change amount ΔIobj is equal to or more than the threshold Th1, the inner circumferential curve IR may be hard to estimate. Therefore, in the second embodiment, in a case where the change amount ΔIobj becomes equal to or more than the threshold, the estimation of the magnetic flux density Bobj along the inner circumferential curve IR is stopped, and the lens reset operation is performed again (Step S246), the variable Ibranch is reset to 0, and the process returns to Step S210. On the other hand, in a case where the change ΔIobj is less than the threshold Th1, the procedure similar to the first embodiment is performed (Steps S260 and S270).

According to the second embodiment, the same effect as that of the first embodiment can be achieved. In addition, in the second embodiment, in a case where the change ΔIobj becomes equal to or more than a predetermined value after the estimation of the magnetic flux density Bobj starts along the inner circumferential curve IR, it is possible to perform the lens reset operation while stopping the estimation operation. Therefore, compared to the first embodiment, it is possible to estimate the magnetic flux density with more accuracy.

Third Embodiment

Next, the scanning electron microscope of a third embodiment of the invention will be described with reference to FIGS. 11 and 12. The first embodiment employs a method in which the outer circumferential curve ER and the inner circumferential curve IR are stored in the database 114, and it is determined whether the operation point is on the outer circumferential curve ER or on the inner circumferential curve IR according to the history of the coil current Iobj.

In contrast, the third embodiment is configured such that the magnetic flux density is estimated using a hysteresis model called a play model.

Figure 11:
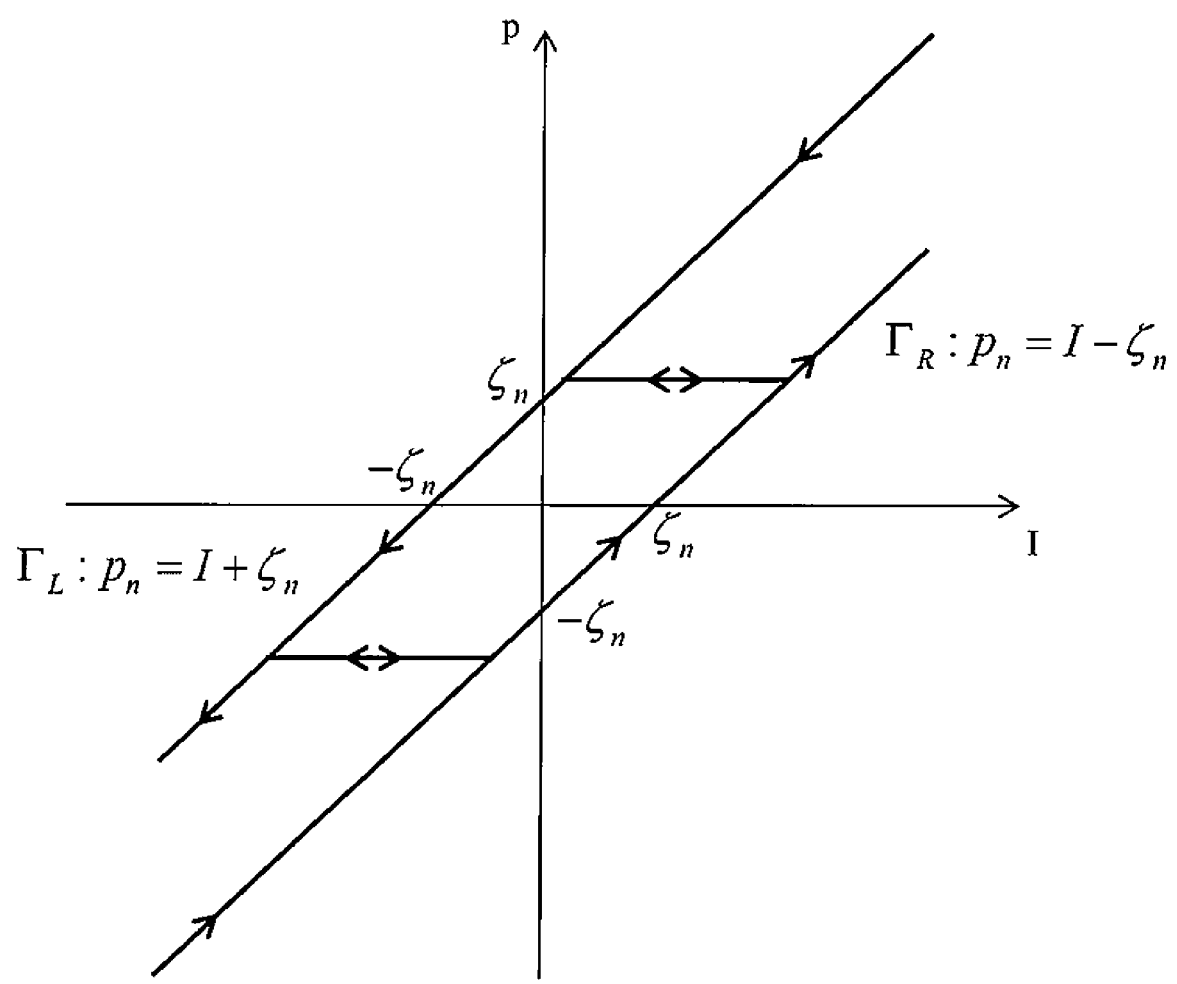
FIG. 11 is a schematic view for describing a play hysteron.

The play model is expressed using a play hysteron illustrated in FIG. 11. In FIG. 11, a straight line ΓR (pn=I−ζn) is used only at the time of increasing the current I (the coil current Iobj), and the straight line ΓL (pn=I+ζn) is used only at the time of decreasing the current I. Herein, ζn is a parameter to assign a width of the play hysteron.

When the current I is shifted from increasing to decreasing or decreasing to increasing, the point (I, pn) moves horizontally between ΓR and ΓL. This relation is expressed by the following [Math. 1].

$$p_n(I) = \max(\min(p_n^0, I+\zeta), I-\zeta) \qquad [\text{Math. 1}]$$

The play model is expressed as a linear sum of the play hysteron as described in the following [Math. 2].

$$B(I) = \sum_{n=1}^{NP} f_n(p_n(I)) \qquad [\text{Math. 2}]$$

Herein, Np is called the number of play hysterons, pn is called the play hysteron of a width ζn, and fn is a single-valued function of pn and called a shape function. The shape function can be identified from a measurement result of a hysteresis loop.

Figure 12:
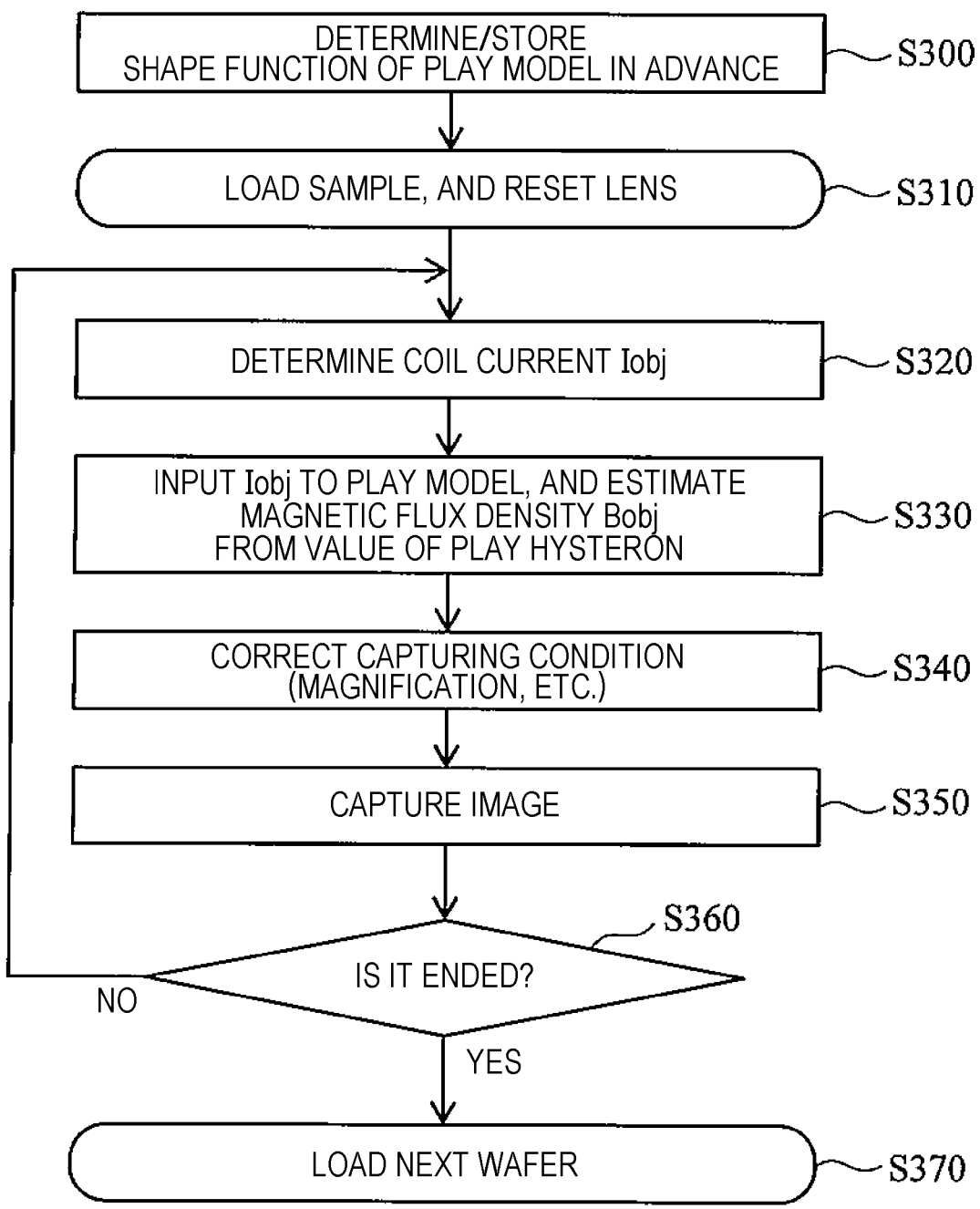
FIG. 12 is a flowchart illustrating an operation of the scanning electron microscope (SEM) according to a third embodiment.

FIG. 12 illustrates an operation of the scanning electron microscope according to the second embodiment. The shape function of the play hysteron is obtained in advance, and stored in the database 114 (Step S300).

Subsequently, the sample S is loaded, and the lens reset operation is performed (FIGS. 4 and 5) (Step S310).

Subsequently, the coil current Iobj is determined (Step S320). The determined coil current Iobj is input to the play model, and the magnetic flux density is estimated from the value of the play hysteron (Step S330). Accordingly, the capturing condition (the deflection magnification and the amount of rotation of image) is calculated, and transmitted to the magnification adjusting unit 118 and the image rotating unit 119. The SEM image is corrected, and the capturing is performed (Steps S340 and S350). With this configuration, similarly to the first embodiment, the lens reset operation is not required or the number of times thereof can be reduced, and the throughput can be improved. In addition, while the play model is used as a model for expressing the hysteresis in this embodiment, the Preisach model which is known to be mathematically equivalent to the play model may be used.

Hitherto, while certain embodiments of the invention have been described, these embodiments have been presented by way of example only, and are not intended to limit the scope of the invention. The novel embodiments described herein may be embodied in a variety of other forms; furthermore, various omissions, substitutions, and changes in the form of the embodiments described herein may be made without departing from the spirit of the invention. The accompanying claims and their equivalents are intended to cover such embodiments or modifications as would fall within the scope and spirit of the invention.

What is claimed is:

1. A charged particle beam device, comprising:
   an electron source which generates an electron beam;
   an objective lens which is applied with a coil current to converge the electron beam on a sample;
   a control unit which controls the coil current to be applied to the objective lens;
   a hysteresis characteristic storage unit which stores hysteresis characteristic information of the objective lens;
   a history information storage unit which stores history information related to the coil current; and
   an estimation unit which estimates a magnetic field generated by the objective lens on the basis of the coil current, the history information, and the hysteresis characteristic information.

2. The charged particle beam device according to claim 1, wherein the history information includes information related to a value of a current at a time when the coil current is switched between increasing and decreasing.

3. The charged particle beam device according to claim 1, wherein the hysteresis characteristic information includes first curve information indicating a relation between the coil current and a magnetic flux density in a case where the coil current is increased from a first current to a second current after a lens reset process and decreased to the first current again, and
   second curve information indicating a relation between the coil current and the magnetic flux density in a case where the coil current is switched between increasing and decreasing before the coil current reaches the first current or the second current after the lens reset process.

4. The charged particle beam device according to claim 3, wherein the second curve information is expressed with a straight line.

5. The charged particle beam device according to claim 1, wherein the hysteresis characteristic information includes a play model which is expressed by a linear sum of a play hysteron.

6. The charged particle beam device according to claim 1, further comprising:
   a focusing lens which converges the electron beam; and
   a focusing lens current correction unit which corrects a coil current of the focusing lens according to the magnetic field estimated by the estimation unit.

7. The charged particle beam device according to claim 1, further comprising:
   a scanning unit which scans the electron beam; and
   a scanning region correction unit which corrects a region scanned by the scanning unit according to the magnetic field estimated by the estimation unit.

8. The charged particle beam device according to claim 1, further comprising:
   a magnification correction unit which corrects a deflection magnification of a captured image according to the magnetic field estimated by the estimation unit.

9. The charged particle beam device according to claim 1, further comprising:
   a rotation correction unit which corrects an image rotation of a captured image according to the magnetic field estimated by the estimation unit.

10. A capturing condition adjusting method in a charged particle beam device which includes an electron source to generate an electron beam and an objective lens applied with a coil current to converge the electron beam on a sample, the method comprising:
    acquiring hysteresis characteristic information of the objective lens;
    performing a lens reset operation on the objective lens;
    determining the coil current;
    acquiring history information related to the coil current; and
    estimating a magnetic field generated by the objective lens on the basis of the coil current, the history information, and the hysteresis characteristic information.

11. The method according to claim 10, further comprising:
    correcting a deflection magnification of a captured image according to the estimated magnetic field.

12. The method according to claim 10, further comprising:
    correcting an image rotation of a captured image according to the estimated magnetic field.

* * * * *